United States Patent [19]
Shimoda et al.

[11] Patent Number: 5,780,931
[45] Date of Patent: Jul. 14, 1998

[54] SURFACE MOUNTING SEMICONDUCTOR DEVICE AND SEMICONDUCTOR MOUNTING COMPONENT

[75] Inventors: Hiroshi Shimoda; Toshihiro Okajima; Hiroshi Kurokawa, all of Tokyo, Japan

[73] Assignee: Mitsubishi Denki Kabushiki Kaisha, Tokyo, Japan

[21] Appl. No.: 655,239

[22] Filed: Jun. 5, 1996

[30] Foreign Application Priority Data

Jun. 9, 1995 [JP] Japan ................................. 7-143047
May 28, 1996 [JP] Japan ................................. 8-133833

[51] Int. Cl.$^6$ .......................... H01L 23/48; H01L 23/52; H01L 29/40; H01L 23/12
[52] U.S. Cl. ........................ 257/779; 257/735; 257/783
[58] Field of Search ..................... 257/779, 783, 257/735

[56] References Cited

U.S. PATENT DOCUMENTS

| | | | |
|---|---|---|---|
| 3,665,590 | 5/1972 | Percival | 257/772 |
| 4,711,026 | 12/1987 | Swiggett et al. | 29/850 |
| 4,859,807 | 8/1989 | Swiggett et al. | 174/68.5 |
| 5,235,139 | 8/1993 | Bengston et al. | 174/257 |
| 5,492,235 | 2/1996 | Crafts et al. | 437/183 |
| 5,607,609 | 3/1997 | Sakuyama et al. | 219/388 |

FOREIGN PATENT DOCUMENTS

| | | |
|---|---|---|
| 56-98849 | 8/1981 | Japan . |
| 59-141237 | 8/1984 | Japan . |
| 1-64246 | 3/1989 | Japan . |
| 1146347 | 6/1989 | Japan . |
| 2-134856 | 5/1990 | Japan . |
| 5190726 | 7/1993 | Japan . |
| 5304235 | 11/1993 | Japan . |
| 6349998 | 12/1994 | Japan . |

*Primary Examiner*—Teresa M. Arroyo
*Attorney, Agent, or Firm*—Leydig, Voit & Mayer, Ltd.

[57] ABSTRACT

A surface mounting semiconductor device or a mounting component includes a metallic carbonate coating on a mounting surface which may be a plated layer of a metal easy to solder on which an outer lead or the like is to be mounted so that the oxidation of the mounting surface of the outer leads during storage is reliability prevented. Upon mounting the semiconductor device to the circuit board with solder, the heat added causes the metallic carbonate coating to decompose, to evolve $CO_3$, and leave active metal, significantly improving solder wettability, so that a reliable solder joint is obtained. Since $CO_3$ is evolved in the gaseous state, it does not stay on the metal surface, eliminating the need for cleaning after the treatment. Because solder wettability is significantly improved, molten solder cannot flow from the side of the soldered joint to bridge outer leads and terminals.

4 Claims, 5 Drawing Sheets

SURFACE MOUNTING SEMICONDUCTOR DEVICE AND SEMICONDUCTOR MOUNTING COMPONENT

BACKGROUND OF THE INVENTION

This invention relates to surface mounting semiconductor devices, semiconductor mounting components and their manufacture in which the wettability for solder or the thermal bonding ability of the mounting surface can be significantly improved and, particularly, to surface mounting semiconductor devices or semiconductor mounting components having a coating on a mounting surface and a method for forming the coating on their mounting surface.

Being supported by recent significant progress in the semiconductor fine processing technique, semiconductor devices have been significantly improved by increasing the capacity, performance, integration and the like. Accordingly, semiconductor devices have not only increased in device size, but also in the number of terminals. Therefore, the external leads inevitably are large in number and have a fine pitch. Some recent external leads have a pitch of 0.5 mm and a clearance of 0.35 mm, and the lead pitch is still narrowing. Semiconductor mounting components, such as surface mounting semiconductor devices, lead frames, TAB tapes or circuit boards require improvements in solderability and thermo-bonding ability to a mounting surface which results in a much more reliable mounting techniques.

Usually, the mounting levels of general semiconductor devices are divided into two. The first mounting level is the one in which the IC chip is mounted (diebonded) to an island portion of a lead frame to establish an electrical connection (wirebonding) and then resin encapsulated. FIGS. 6a to 9 are views showing a conventional method in this stage.

Figure 6A:
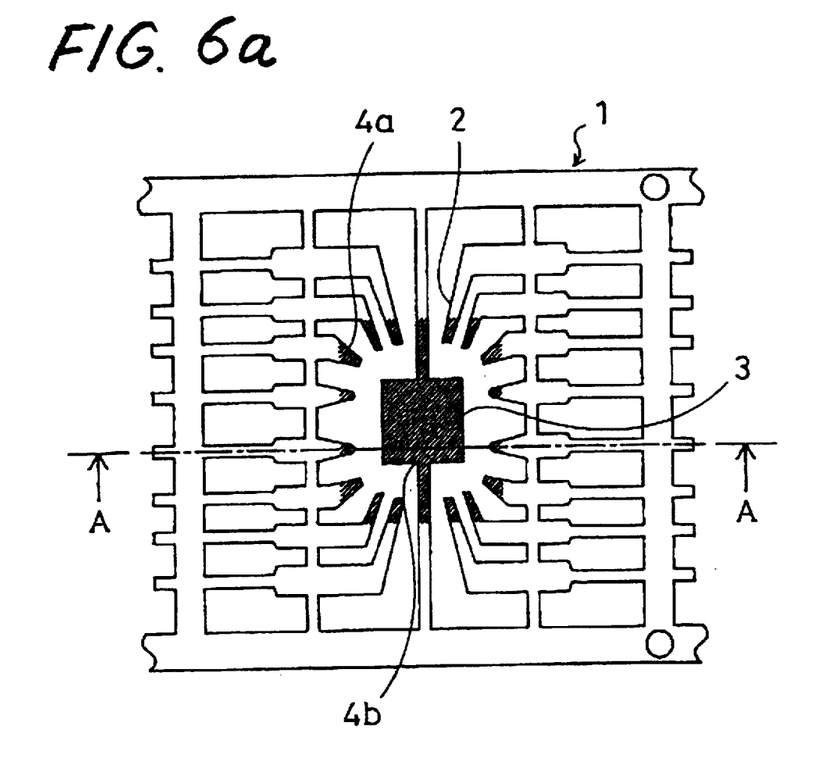
FIG. 6a is a plan view of the conventional lead frame.
Figure 6B:
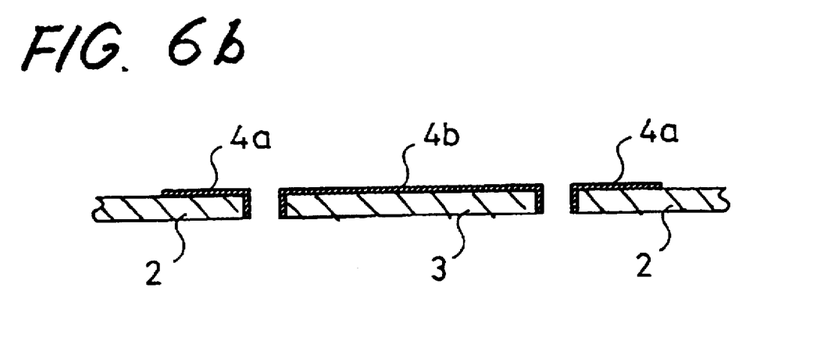
FIG. 6b is a sectional view of the conventional lead frame.
Figure 7:
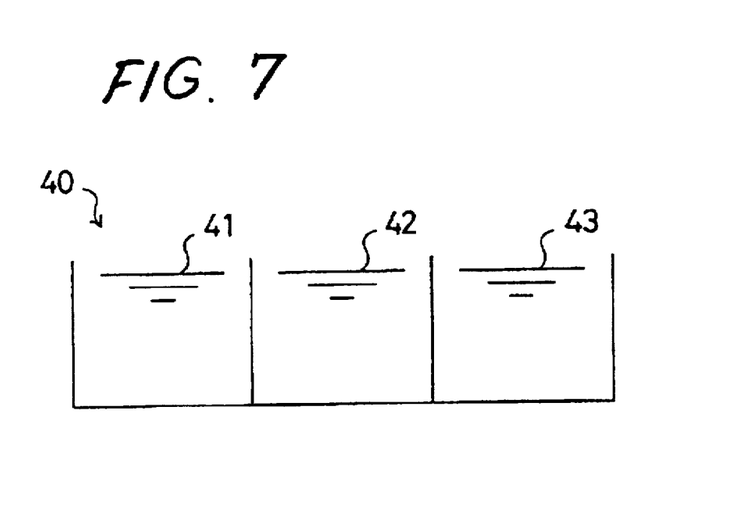
FIG. 7 is a sectional view of the conventional plating treatment apparatus.

FIGS. 6a and 6b show a lead frame. FIG. 6a being a plan view and FIG. 6b being a sectional view taken along line 6a—6a of FIG. 6a. In the Figures, the reference numeral 1 is the lead frame, 2 is an internal lead, 3 is an island, 4a, 4b are metal-plated layers made of silver, gold, copper and the like and are silver-plated layers. FIG. 7 is a view illustrating a conventional treatment apparatus for forming the metal-plated layers 4a and 4b on the lead frame, the treatment apparatus 40 comprises a silver plating tank 41, a pure water tank 42 and a super pure water tank 43. In the silver plating tank 41, silver plated layers 4a and 4b are formed on the surface of the lead frame 1, and the lead frame 40 is washed and then dried in a drying apparatus (not shown).

Figure 8:
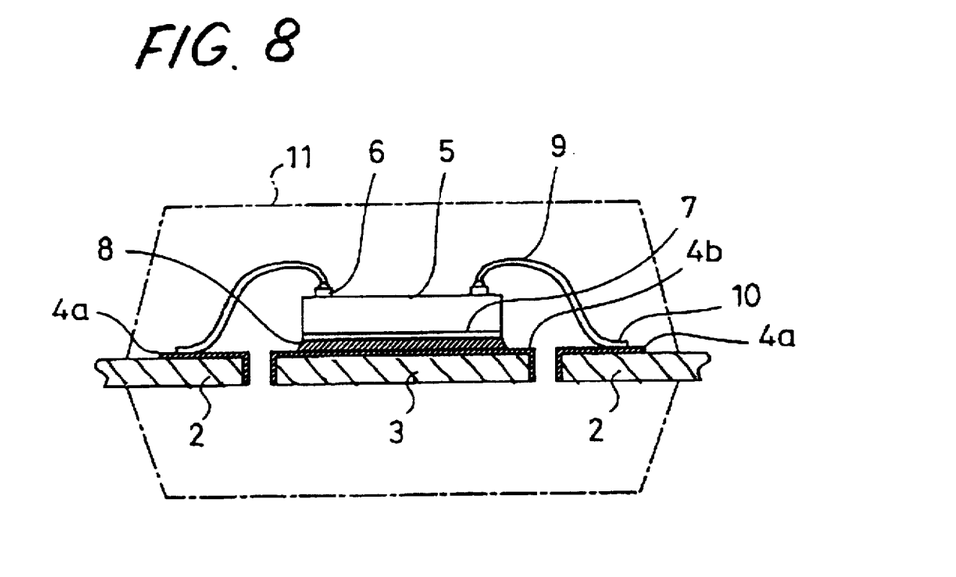
FIG. 8 is a sectional view illustrating the state in which the conventional surface mounting semiconductor device and the circuit board are mounted.

FIG. 8 shows the first stage mounting. The silver-plated layer 4b of the island 3 has solder-mounted thereon by a bonding material (Pb-Sn system solder) 8 an IC chip 5 having a metallized layer 7 on its reverse side, and one end of each connecting wire 9 made of Au is ball-bonded to the electrode 6 of the IC chip 5 and the other end 10 is thermo-bonded to the silver-plated layers 4a of the inner lead 2. Thereafter, these inner leads 2, the island 3, the IC chip 5, and the connecting fine wires 9 are encapsulated by an encapsulating resin 11 and, as described later in connection with FIG. 9, the outer leads 12 are bent, and metal-plated layers 13 of Pb/Sn, Sn or the like are formed on the surface of the outer leads 12 to complete the product of an IC 14. Thus, according to the conventional technique, in order to make the soldering of the IC chip 5 and thermo-bonding of the end 10 of the connecting fine wires 9 reliable, the silver-plated layers 4a and 4b have been formed on the mounting surface of the inner leads 2 and the island 3.

Figure 9:
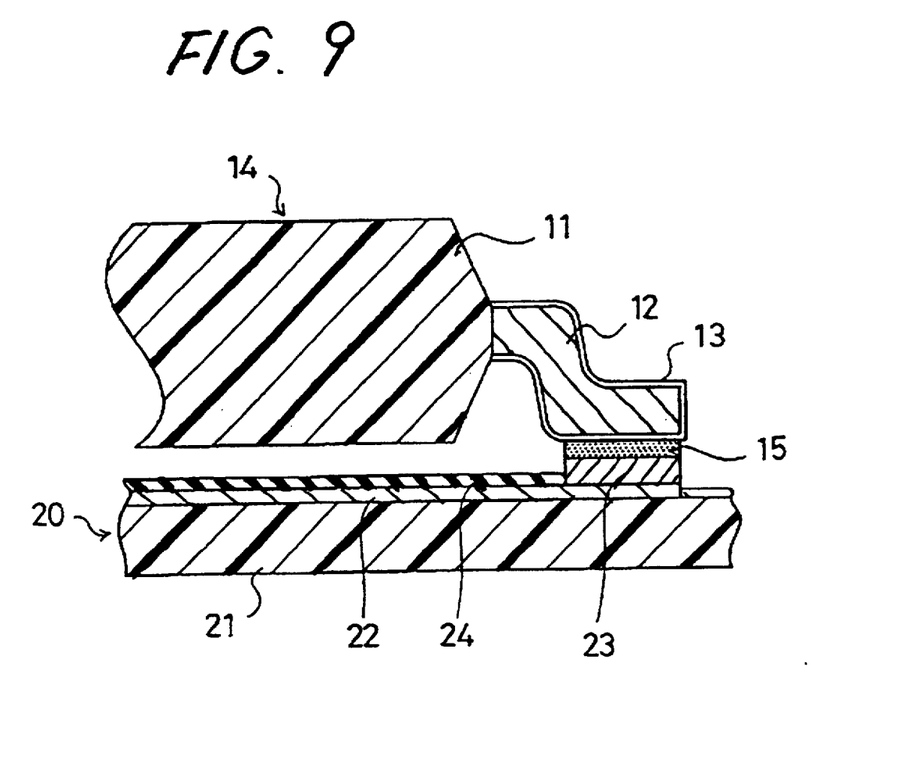
FIG. 9 is a view illustrating how the conventional IC is mounted to the circuit board.

The second stage of mounting is the stage in which the IC 14 is mounted to a circuit board. FIG. 9 illustrates how the IC is mounted to the circuit board. In this figure, a circuit board 20 comprises a substrate 21 having a metal wiring 22 formed thereon, substrate electrodes 23 made of plated-silver and disposed on the end portion of the electrode 22 and an electrically insulating coating 24 disposed to cover the surfaces of the metal wiring 22 and the substrate 21. In mounting the IC 14 to the circuit board 20, the solder cream 15 in a paste-like state is formed on the substrate electrode 23 in a thickness of 200–400 μm by printing and, after the outer lead 12 of the IC 14 is placed thereon, the solder cream 24 is heated by infra-red heating For Example to melt and solidify the solder.

However, with the conventional mounting method as described, in which the silver-plated layers 4a and 4b, the metal-plated layer 13 or the substrate electrodes 23 are formed on the surface of the mounting member to suppress the degrading of the wettability of the mounting surface due to oxidation until mounting, it has been difficult to maintain the mounting surface in an active state and has been difficult to obtain a satisfactory solder wettability and thermo-bonding ability. Therefore, a very strict quality control has been required which includes the washing water which is used in washing after the formation of the metal-plated layer, packaging and storage control of the completed semiconductor devices, lead frames, circuit boards and the like, and mounting condition control needed when the components quality is variable upon mounting.

When a sufficient wettability for solder cannot be obtained, a problem may be arise in which the molten solder cream flows from out of the bonding surfaces and bridges the narrow gaps between the fine terminals when an IC having a narrow-pitch, fine-pin outer leads is to be mounted to a circuit board. Further, since the solder cream contains an activator (flux) containing a high concentration chlorine in order to improve the soldering ability, the flux must be effectively washed in view of the prevention of metal erosion after the mounting step, resulting in an increase in cost.

Although there have been many techniques proposed to solve the above discussed problems, only some of them will now be discussed. Japanese Patent Laid Open No. 1-146347 proposes that, in order to improve the solderability without polluting the environment, a chlorine concentration layer of 0.3%~2% is formed on a Ni-P alloy lead frame. Japanese Patent Laid-Open No. 5-304235 proposes that, in order to suppress oxidation in an atmospheric condition to improve the solder wettability, a Ni-plated surface of a lead frame is treated with an acid ammonium fluoride solution of a concentration of 5~20 weight % to form an oxide coating ($NiO_2$). Japanese Patent Laid-Open No. 6-349998 proposes that, in order to improve the solder wettability to the extent that soldering can be achieved without flux, the Cu-containing lead frame is brought into contact with a solution containing silver hydrogen cyanide and a hydrophilic organic material to form a surface coating. Japanese Patent Laid-Open No. 5-190726 discloses, in order to prevent surface discoloring and improve wire-bonding ability, the formation of silver oxide on the silver-plated surface of the lead frame by anodic oxidation. Japanese Patent Laid-Open No. 56-98849 discloses the formation of an oxidation preventing coating after the washing of the lead frame surface so that a good soldering can be achieved without the need for the flux. Japanese Patent Laid-Open No. 59-141237 discloses, so as to prevent oxidation and pollution of the pad surface the good die-bonding, the formation of a layer of a complex salt after the die-bonding portion surface of the lead frame is cleaned.

While each of these conventional techniques has some desirable features, respectively, on one hand, at the same time each has some problem in that the process for forming various coatings is difficult and complete washing for removing the remaining flux is required after the completion of the mounting from the view point of the corrosion prevention, which increases the cost. It is also desirable to shorten the time needed for the mounting process by means of soldering or thermo-bonding.

SUMMARY OF THE INVENTION

Accordingly, one object of the present invention is to provide a surface mounting semiconductor device free from the above-discussed problems of the conventional semiconductor device.

Another object of the present invention is to provide a surface mounting semiconductor device in which the soldering or thermo-bonding or the like of the outer leads or the like to a circuit board is easy and reliable.

Another object of the present invention is to provide a semiconductor mounting component in which the mounting surface is significantly improved in solder wettability and thermo-bonding ability.

Still another object of the present invention is to provide a semiconductor device manufacturing method for manufacturing a surface mounting semiconductor device or semiconductor device mounting component in which the mounting surface is improved in solder wettability and the thermo-bonding ability.

With the above objects in view, the present invention resides in a surface mounting semiconductor device wherein a mounting surface on which an outer lead or the like is to be mounted by means of a solder or the like has formed thereon a metal carbonate coating.

The mounting surface may have formed thereon a metal-plated layer and the metal-plated layer may have formed thereon a metal carbonate coating.

A semiconductor device mounting component such as a lead frame, a TAB tape, a circuit board and the like of the present invention comprises a mounting surface, to which an electrode or an external lead or the like of a semiconductor chip, is to be formed by means of a solder or thermal bonding or the like has formed thereon a carbonated metal coating.

The mounting surface of the component may have formed thereon a metalplated layer and the metal-plated layer may have formed thereon a carbonated metal coating.

A manufacturing method of a surface mounting semiconductor device or a semiconductor mounting component of the present invention comprises the steps of preparing a surface mounting semiconductor device or a semiconductor mounting component having a mounting surface, and bringing the mounting surface into a contact with a solution containing carbon to form a metallic carbonate coating on the mounting surface. The solution may contain a component exhibiting an activating function such as chlorine, fluorine, ammonium, nitric acid ions, a surface active agent or the like, and the step of bringing the mounting surface into contact with the solution comprises immersing the mounting surface into the solution.

Another manufacturing method of a surface mounting semiconductor device or a semiconductor mounting component of the present invention comprises the steps of preparing a surface mounting semiconductor device or a semiconductor mounting component having a mounting surface, forming a metal-plated layer at least on the mounting surface, and bringing the metal-plated layer into contact with a solution containing carbon to form a metallic carbonate coating on the metal-plated layer.

The step of forming the metal plated layer may comprise a step of immersing the mounting surface within a metal plating treatment tank, and the step of forming the metal-plated layer comprises a step of immersing into a solution containing a component exhibiting an activating function such as chlorine, fluorine, ammonium, nitric acid ions, surface active agent or the like.

A surface mounting semiconductor device of the present invention may comprise a mounting surface on which an external lead or the like is to be mounted has formed thereon a solder-plated layer and the solder-plated layer has formed thereon an oxide coating containing at least 10% of lead oxide.

A semiconductor device mounting component such as a lead frame, a TAB tape, a circuit board and the like, wherein a mounting surface thereof for mounting thereon by means of a solder an electrode or an outer lead or the like of a semiconductor chip has formed thereon a solder-plated coating containing lead, and the solder-plated coating has formed thereon an oxide coating containing at least 10% of lead oxide.

A manufacturing method of a surface mounting semiconductor device or a semiconductor mounting component comprising the steps of preparing a surface mounting semiconductor device or a semiconductor mounting component having a mounting surface on which a solder-plated layer containing lead is formed, and bringing the mounting surface into contact with a solution containing carbon to form an oxide coating containing at least 10% of lead oxide on the mounting surface.

It is to be noted that the semiconductor mounting component in this application includes a semiconductor lead frame, a TAB (Tape Automated Bonding) tape having a conductive film to be soldered to the electrodes of an IC chip, a circuit board to which a semiconductor device is mounted and the like. It is the TAB tape or the circuit board to which the electrodes or the outer leads of a semiconductor chip are soldered.

As described, the surface mounting semiconductor device of the present invention comprises a metallic carbonate coating on a mounting surface on which an outer lead or the like is to be mounted by means of a solder or the like, so that the oxidization of the mounting surface during storage is prevented. Since the soldering of the semiconductor device to the circuit board is achieved by melting and solidifying the solder as a bonding material, the heat added during the soldering thermally decompose the metallic carbonate coating to cause $CO_3$ to scatter and leave active metal, whereby the wettability of the surface of the mounting component is significantly improved and a reliable solder joint can be obtained. This also applies to the case to the thermobonding.

Also, the surface mounting semiconductor device of the present invention has formed on the surface to which the outer leads or the like are mounted by the soldering or the thermo-bonding or the like a metal-plated layer of a metal easy to solder or the like and this metal-plated layer in turn has formed thereon a metallic carbonate coating, so that the surface of the metal plated layer being stored can be protected against oxidization. Since the soldering of the semiconductor device to the circuit board is achieved by melting and solidifying the solder as a bonding material, the heat added during the soldering thermally decompose the metallic carbonate coating to cause $CO_3$ to scatter and leave active metal, whereby the wettability of the surface of the mounting component is significantly improved and a reliable solder joint can be obtained. This also applies to the case to the thermo-bonding.

Also, according to the surface mounting semiconductor device of the present invention, when the mounting surface to which the outer leads or the like are soldered has formed thereon a Pb-Sn system plated solder layer and is subjected to a treatment similar to that just described, an oxide coating of $PbO_2$ and $SnO_2$ is formed on this surface. In this case, the oxide coating contains at least 10% of lead oxide ($PbO_2$). While the lead oxide is decomposed into an active lead by the heat added during the soldering, the tin oxide does not decompose by that heat. Therefore, the lead oxide formed on the mounting surface is thermally decomposed upon the soldering to cause the mounting surface to be activated and cleaned, allowing a reliable bonding to be obtained.

Also, the semiconductor mounting component of the present invention has formed, on the mounting surface to which the semiconductor chip, the connecting fine wire, the electrode or outer leads of the semiconductor chip or the like are mounted, a metallic carbonate layer, so that the surface of the metal plated layer being stored can be protected against oxidization. Upon soldering, the heat decomposes the metallic carbonate coating to cause $CO_3$ to scatter and leave active metal, whereby the wettability of the mounting surface is significantly improved and a reliable solder joint can be obtained.

Also, the semiconductor mounting component of the present invention has formed, on the mounting surface, to which the semiconductor chip, the connecting fine wire, the electrode or outer leads of the semiconductor chip or the like are mounted, a metal-plated layer to which the soldering, the thermo-bonding or the like is easy and a metallic carbonate coating is formed on it, so that the surface of the metal plated layer being stored can be protected against oxidization. Upon soldering, the heat decomposes the metallic carbonate coating to cause $CO_3$ to scatter and leave active metal, whereby the wettability of the mounting surface is significantly improved and a reliable solder joint can be obtained.

Also, according to the semiconductor mounting component of the present invention, the mounting surface to which the outer leads or the like are soldered has formed thereon a Pb-Sn system plated solder layer and an oxide coating containing at least 10% of lead oxide is formed thereon. This oxide coating is stable and does not change during the storage. Upon soldering, the heat decomposes the lead oxide ($PbO_2$) in the oxide coating to allow the active lead (metal) to stay, whereby the wettability of the mounting surface is significantly improved and a reliable solder joint can be obtained even with a small amount of solder and the solder does not flow out of the side of the joint surface.

According to a manufacturing method of a surface mounting semiconductor device or a semiconductor mounting component of the present invention, a mounting surface, to which a surface mounting semiconductor device, the semiconductor mounting component or the like is mounted by soldering, thermo-bonding or the like, is brought into contact with a solution containing carbon and a component exhibiting an activating function such as chlorine, fluorine, ammonium, nitric acid ions, a surface active agent or the like to form a metallic carbonate coating on the mounting surface, so that the mounting surface is not oxidized and polluted by the environmental conditions in the manufacturing and storage, ensuring that a reliable junction can be obtained According to a manufacturing method of a surface mounting semiconductor device or a semiconductor mounting component of the present invention, a mounting surface, to which a surface mounting semiconductor device, the semiconductor mounting component or the like is mounted by soldering, thermo-bonding or the like, is immersed into a metal-plating tank to form a metal-plated layer to which the soldering and the thermo-bonding is easy and, thereafter, this layer is brought into contact with a solution containing carbon and a component exhibiting an activating function such as chlorine, fluorine, ammonium, nitric acid ions, a surface active agent or the like to form a metallic carbonate coating on the metal-plated layer, so that the surface of the metalplated layer is not oxidized and polluted in the manufacturing and storage, ensuring that a reliable junction can be obtained.

According to a manufacturing method of a surface mounting semiconductor device or a semiconductor mounting component of the present invention, a mounting surface, to which the electrode or an outer lead of the surface mounting semiconductor device or the semiconductor device is soldermounted, is immersed into the metal plating tank to form a solder-plated layer thereon, and, thereafter, this layer is brought into contact with a solution containing carbon and a component exhibiting an activating function such as chlorine, fluorine, ammonium, nitric acid ions, a surface active agent or the like to form an oxide coating containing at least 10% of lead oxide on the surface of the Pb-Sn system solder-plated layer metallic carbonate coating on the metalplated layer, so that the surface of the solder-plated layer is not oxidized and polluted in the manufacturing and storage, ensuring that a reliable junction during the mounting can be obtained.

BRIEF DESCRIPTION OF THE DRAWINGS

The present invention will become more readily apparent from the following detailed description of the preferred embodiments of the present invention taken in conjunction with the accompanying drawings, in which.

DESCRIPTION OF THE PREFERRED EMBODIMENTS

Embodiment 1

Figure 1:
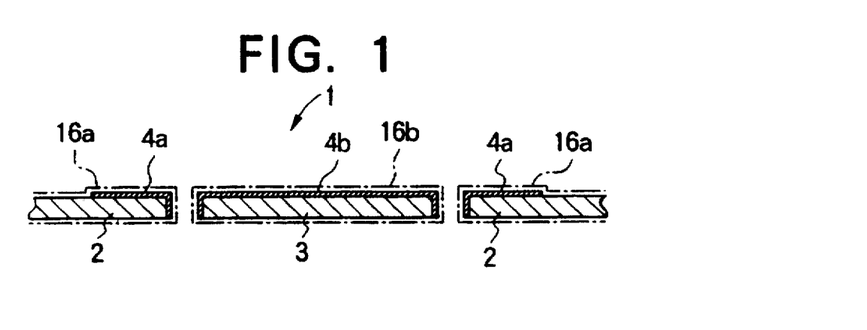
FIG. 1 is a sectional view of the main portion of a lead frame according to the first embodiment of the present invention.

The first embodiment of the present invention will now be described in conjunction with the accompanying drawings. FIG. 1 is a sectional view of the main portion of the lead frame and corresponds to FIG. 6b showing the conventional lead frame. In FIG. 1, a lead frame 1, comprises inner leads 2, an island 3 and a metal-plated layer 4. 4a and 4b are plated layers made of silver, gold, copper or the like to which soldering or thermo-bonding is easy, the plated layer of this embodiment being silver. 16a and 16b are a metallic carbonate coatings formed on the entire surface of the silver plated layers 4a and 4b. These metallic carbonate layers 16a and 16b are, as described later, formed by immersing the silver plated layers 4a and 4b in a solution containing at least carbon and which may contain a component exhibiting an activating function such as chloride, fluorine, ammonium, nitric acid ions, interface activator or the like to cause it to be brought into contact with the solution. Of course, the metal in the metallic carbonate coating is silver, gold, copper or the like according to the metal used as the plated layer. It is to be noted that the same reference numerals designate identical or corresponding components throughout the drawings, and the description will be made only in terms of the components with new reference numerals in the Figures of the embodiments of the present invention. Also, in the Figures of the present application, the metallic carbonate coatings 16a and 16b are illustrated as being formed on top of the silver plated layers 4a and 4b, only for the purpose of clarity of the illustration. In actuality, the metallic carbonate coatings 16a and 16b are surface regions of the silver-plated layers 4a and 4b that are carbonated and changed into thin coatings.

Figure 2:
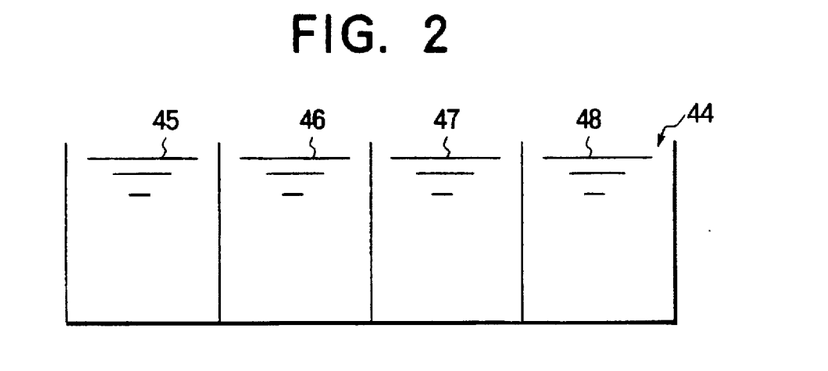
FIG. 2 is a sectional schematic view of the metallic carbonate coating forming apparatus for forming the metallic carbonate coating of the first embodiment.

The manufacturing process of the lead frame 1 having the metallic carbonate coatings 16a and 16b in this embodiment will now be described. FIG. 2 illustrates a treatment apparatus for forming the metallic carbonate coating. This metallic carbonate coating forming apparatus 44 comprises an activating tank 45 containing a 10±5% solution of soda cyanide solution, a metallic carbonate coating treatment tank 46 containing a 20±5% solution of a chloride, a pure water washing tank 47 and a super pure water washing tank 48. In forming the metallic carbonate coating 16 with this treatment apparatus 44, the lead frame 1 is first immersed into the activating tank 45 and kept therein for about 30 seconds to clean and activate the surface of the silver plated layer 4. Thereafter, this is placed into the metallic carbonate coating treatment tank 46 to form a metallic carbonate coatings of about 0.1~20 ng/cm$^2$ on the activated silver plated layers 4a and 4b. Then, the lead frame 1 is washed in the pure water tank 47 and the super pure water washing tank 48 in the named order to stabilize the formed coatings. Thereafter, the lead frame 1 taken out from the super pure water washing tank 48 is placed in a drying apparatus (not shown) to remove water and dry, whereupon the manufacture of the lead frame 1 with the silver plated layers 4a and 4b formed on the surface of the metallic carbonate coatings 16a and 16b is completed.

It is also to be noted that although the portion actually needed to be coated with the metallic carbonate coatings 16a and 16b are the surfaces of the silver plated layers 4a and 4b, the entire surface of the lead frame 1 is coated with the metallic carbonate coating because of the manufacturing method in this embodiment and no problem arises.

The function in the IC mounting process of the metallic carbonate coatings 16a and 16b thus formed will now be described. When the IC chip 5 is mounted by solder on the island 3 of the lead frame 1 to which the silver plated layers 4a and 4b on which the metallic carbonate coatings 16a and 16b are formed, the metallic carbonate coating 16b on the silver plate layer 4b on the island 3 is decomposed by the heat applied upon soldering and $CO_3$ from the metallic carbonate coatings 16 evolves. As a result, the surface of the silver plated layer 4b is cleaned and activated and active Ag is left behind, whereby the wettability of the metallic carbonate coating 16b on the silver plated layer 4b is significantly improved. According to the experiments of the inventors of the present invention, when an IC chip 5 is to be soldered to the conventional silver plated layer 4b without coating by a solder of Pb 95% and Sn 5%, it was necessary to apply a heat of 360° C. for 1.5 to obtain a satisfactory solder bonding, whereas the same IC chip 5 was satisfactorily soldered to the same silver plated layer 4b having the metallic carbonate coating 16b of this embodiment by the same solder at a heat of 320° C. maintained for 0.5 second. This is an advantageous result obtained because of the metallic carbonate coating 16b on the silver plated layer 4b, which is decomposed by the heat stress of 320° C. and causes $CO_3$ to be evolved and leave the active Ag on the silver plated layer 4b.

Similarly, when an end 10 of a connecting fine wire 9 made of Au is thermo-bonded or heat-bonded to the lead frame 1 having the silver plated layer 4a on which the metallic carbonate coating 16a is formed, the heat applied upon bonding causes the metallic carbonate coating 16a on the silver plated layer 4a to decompose to cause $CO_3$ to be evolved and Ag to remain thereon. Therefore, the silver plated layer 4a is activated and cleaned, whereby the surface of the cleaned silver plated layer 4a is significantly improved in thermo-bonding ability, allowing the temperature and time applied for thermo-bonding to be significantly reduced.

The metallic carbonate coatings 16a and 16b above described stay on and protect the stitch bonding portion surface or the die bonding portion surface as protective films against oxidation and pollution by the environmental air except when they are heated to decompose and at the time of mounting.

Also, while the metallic carbonate coatings 16a and 16b are formed on the silver plated layers 4a and 4b formed on the inner leads 2 or the island 3 of the lead frame 1, the metallic carbonate coating 5 may equally be formed directly on the surface of the inner leads 2 or the island 3 after they are cleaned.

Embodiment 2

Figure 3:
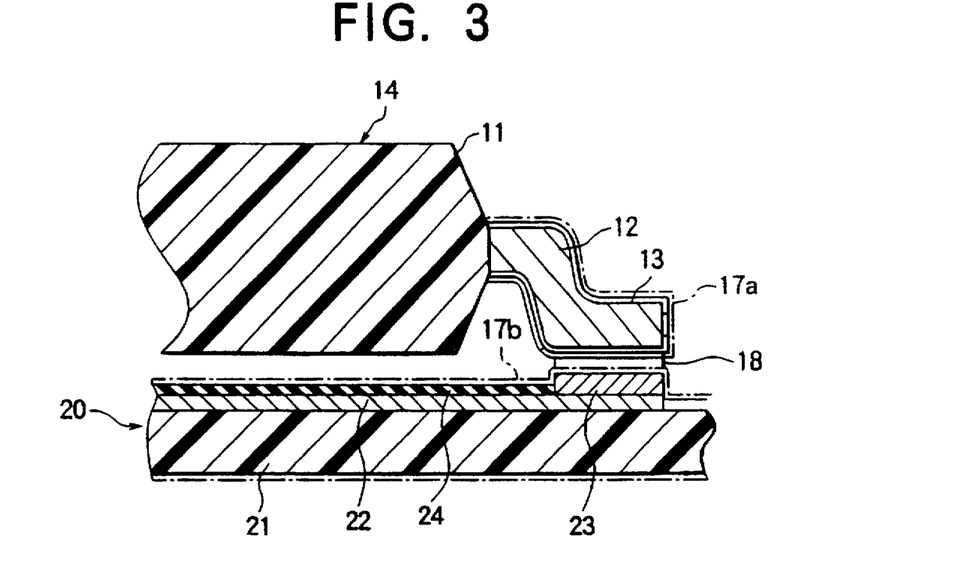
FIG. 3 is a sectional view illustrating the state in which the surface mounting semiconductor device and the circuit board are mounted according to the second embodiment of the present invention.

A description will be made in terms of the second embodiment of the present invention in conjunction with the drawings. FIG. 3 is a sectional view illustrating the manner in which the surface mounting semiconductor device to which the present invention is applied is mounted to the circuit board. In the figure, the reference numeral 20 is a circuit board, 21 is a substrate made For Example of a glass epoxy material, 22 is metal wiring made of a copper foil formed into a pattern on the substrate 21, 23 are circuit board electrodes, which are disposed at a predetermined position on the metal wiring 22 to which an IC 14 or inactive element such as a resistor or a capacitor (not shown) and on which silver, tin, gold, copper or the like is plated, are soldered. The reference numeral 24 is an electrically insulating film covering the substrate 21 and the metal wiring 22, 13 is a metal plated layer on the surface of the outer lead 12 and made of a metal such as silver, tin or the like which is easy to solder, 17a is a metallic carbonate coating on the metal plated layer 13, 17b is a metallic carbonate coating on the circuit board electrode 23 and 18 is a solder ribbon containing no activating flux and having a thickness of about 20–30 μm.

Upon mounting the IC 14 to the circuit board 20, the solder ribbon 18 is heated by infra-red rays to melt it in a manner similar to the conventional technique. Then, the metallic carbonate coating 17a on the metal plated layer 13 of the outer lead 12 and the metallic carbonate coating 17b on the circuit board electrode 23 are decomposed by the heat and Ag remains on the surfaces of the metal plated layer 13 and the circuit board electrode 23 to activate and clean them. Therefore, the solder wettability of the surfaces of the metal plated layer 13 and the circuit board electrode 23 are significantly improved, so a reliable solder joint can easily be obtained. Moreover, the amount of the solder ribbon 18 may be significantly reduced as compared to the conventional technique at this time, since no molten solder flows out of the side portion of the joining surface so that bridging between the neighboring outer leads 12 and the circuit board electrodes 23 does not take place. In this embodiment, the formation of the metallic carbonate coatings 17a and 17b may be achieved in the same process as that described in conjunction with the first embodiment. Also, while the metallic carbonate coating 17a is formed on the metal plated layer 13 on the outer lead 12, the metallic carbonate coating 17a may directly be formed on the outer leads 12 after their surfaces are cleaned.

Embodiment 3

Figure 4:
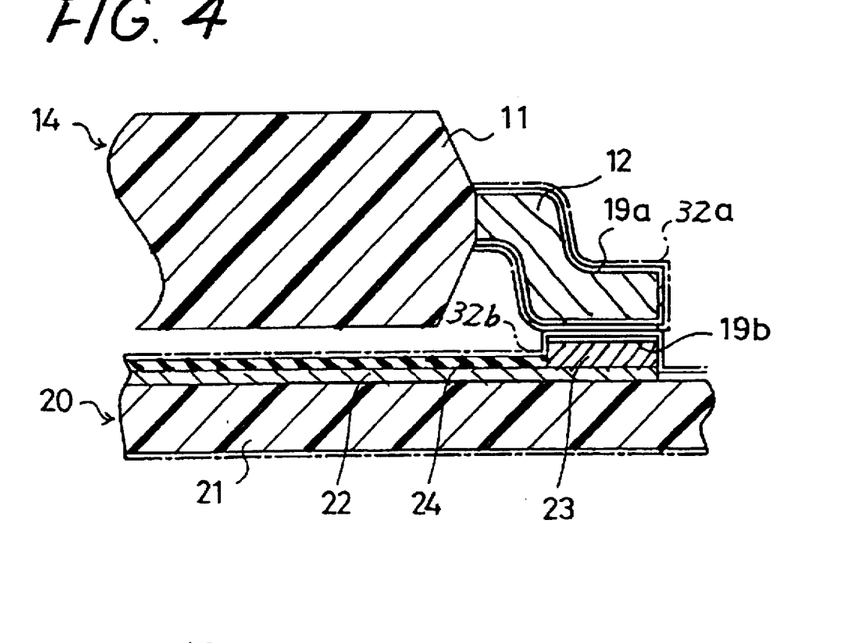
FIG. 4 is a sectional view illustrating the state in which the surface mounting semiconductor device and the circuit board are mounted according to the third embodiment of the present invention.

The description will now be made as to the third embodiment of the present invention taken in conjunction with the drawings. FIG. 4 is a sectional view illustrating the state in which the surface mounting semiconductor device of the present invention is mounted to the circuit board. In the figure, the reference numerals 19a and 19b are solder plated layers of the Pb-Sn system and formed on the outer leads 12 and the circuit board electrode 23, respectively, and 32a and 32b are oxide coatings formed on the solder plated layers 19a and 19b and containing lead oxide ($PbO_2$) and tin oxide ($SnO_2$). The composition ratio of the lead oxide is not less than 10% and, preferably, not less than 20%. In this case, the oxide coatings 32a and 32b are formed in a similar manner as that in the first embodiment. When the oxide coatings are heated by infra-red rays or the like as in the conventional technique, the heat causes the $PbO_2$ (lead oxide) in the oxide coatings to decompose to form (metal) lead and the outer leads and the surfaces of the circuit board electrodes 28 are activated and cleaned. Therefore, the solder wettability of the surfaces of the metal plated layer 12 and the circuit board electrode 23 are significantly improved, so a reliable solder joint can easily be obtained. Moreover, the amount of the solder plated layers 19a and 19b may be significantly reduced as compared to the conventional technique at this time, since no molten solder flows out of the side portion of the joining surface so that bridging between the neighboring outer leads 12 and the circuit board electrodes 23 does not take place.

Embodiment 4

Figure 5:
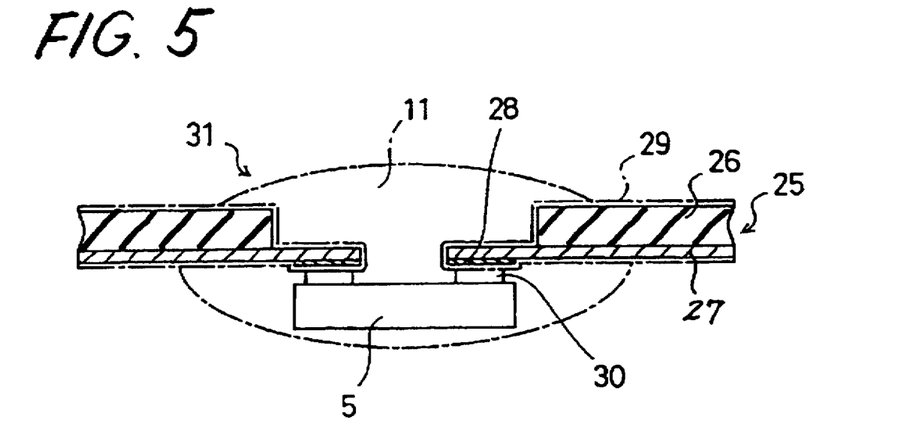
FIG. 5 is a sectional view illustrating the state in which the TAB semiconductor device is mounted according to the fourth embodiment of the present invention.

The fourth embodiment of the present invention will now be described in conjunction with the drawings. FIG. 5 is a sectional view illustrating the manner in which the TAB type semiconductor device to which the present invention is mounted is mounted. In the figure, the reference numeral 30 is a projecting electrode (hereinafter referred to as a bump) made of Au or the like on the IC chip 5, 25 is a TAB tape comprising a film carrier 26 made of a wide polyimide sheet having a thickness of 125 μm and a beam lead 27 formed into a lead-like shape by the photoengraving process. The reference numeral 28 is an Ag plated layer formed on the surface of the beam lead 27 and 29 is a metallic carbonate coating formed on the Ag plated layer 28 in the manner similar to that of the first embodiment. When the bump 30 and the beam lead 27 are pressed against each other and heated, the heat causes the metallic carbonate coating 29 to decompose to cause $CO_3$ to be evolved and leave Ag, whereby the surfaces of the beam lead 27 and the bump 30 are activated and cleaned. Therefore, the solder wettability of the surfaces of the Au and Ag are significantly improved, so a reliable solder joint can easily be obtained.

When the above plated layer 28 is a solder plated layer of the Pb - Sn system, a similar treatment to that in the first embodiment is carried out to form an oxide coating containing at least 10% and preferably at least 20% of lead oxide ($PbO_2$) on the solder plated layer. When the bump 30 and the beam lead 27 are held together under pressure and heated, the heat causes the $PbO_2$ to decompose to form lead and the surface of the beam lead 27 and the bump 30 are activated and cleaned. Then, the solder wettability of the surfaces of Au and Cu are significantly improved, so a reliable solder joint can easily be obtained.

As has been described, the surface mounting semiconductor device of the present invention comprises a metallic carbonate coating on a mounting surface on which an outer lead or the like is to be mounted, so that the oxidation of the mounting surface of the outer leads during storage can be surely prevented. Also, upon mounting the semiconductor device to the circuit board by solder or the like, the heat added causes the metallic carbonate coating to be decomposed to cause $CO_3$ to be evolved and leave active metal to significantly improve solder wettability, whereby a reliable solder joint can be obtained. Also, since $CO_3$ is evolved in the gaseous state at the time of decomposition, it does not stay on the metal surface, eliminating the need for washing after the treatment.

Also, the surface mounting semiconductor device of the present invention has formed on the surface to which the outer leads or the like are mounted a metal-plated layer of a metal easy to solder or the like and this metal-plated layer in turn has formed thereon a metallic carbonate coating,. so that the mounting surface of the metal plated layer being stored can be surely protected against oxidation. At the time of soldering of the semiconductor device to the circuit board, the heat added during the soldering causes the metallic carbonate coating to thermally decompose to activate and clean the surface of the metal plated layer, whereby the solder wettability is significantly improved and a reliable solder joint can be obtained. Therefore, it cannot happen that the molten solder flows out of the side of the joint surface and bridges the outer leads and the terminals.

Also, the semiconductor mounting component of the present invention has formed, on the mounting surface to which the semiconductor chip, the connecting fine wire, the electrode or outer leads of the semiconductor chip or the like are to be mounted, a metallic carbonate layer, so that the mounting surface during storage can be surely protected against oxidation. Upon mounting, the heat applied causes the metallic carbonate coating to decompose to activate and clean the mounting surface, whereby the solder wettability and the thermo-bonding ability are significantly improved and a reliable solder joint can be obtained.

Also, the semiconductor mounting component of the present invention has formed, on the mounting surface to which the semiconductor chip, the connecting fine wire, the electrode or outer leads of the semiconductor chip or the like are mounted by soldering, thermo-bonding or the like, a metal-plated layer to which the soldering, the thermo-bonding or the like is easy and a metallic carbonate coating is formed on it, so that the surface of the metal plated layer being stored can be surely protected against oxidation. Upon mounting, the heat causes the metallic carbonate coating to decompose to activate and clean the metal plated layer surface, whereby the wettability is significantly improved and a reliable solder joint can be easily obtained.

Also, according to the semiconductor mounting component of the present invention, the mounting surface to which the outer leads or the like are soldered has formed thereon a Pb-Sn system plated solder layer and an oxide coating containing at least 10% of lead oxide, so that the deterioration (in terms of solderability) of the surface during the storage can be prevented. Upon mounting, the heat applied causes the lead oxide ($PbO_2$) in the oxide coating decompose to be activated and cleaned, whereby the wettability of the mounting surface is significantly improved and a reliable solder joint can be obtained. Moreover, since the amount of the solder needed at this time is very small, the solder does not flow out of the side of the joint surface and bridges the electrodes and the outer leads.

According to a manufacturing method of a surface mounting semiconductor device or a semiconductor mounting component of the present invention, a mounting surface for the mounting is immersed in a solution containing a composition exhibiting an activating function to form a metallic carbonate coating on the mounting surface, so that the mounting surface is not oxidized and polluted by environmental conditions in manufacturing and storage, ensuring that a reliable junction can be obtained.

According to a manufacturing method of a surface mounting semiconductor device or a semiconductor mounting component of the present invention, a mounting surface for the mounting is provided with a metal-plated layer to which the soldering and the thermo-bonding is easy and, thereafter, this layer is immersed within a solution containing a component including carbon to form a metallic carbonate coating on the metal-plated layer, so that the surface of the metal-plated layer is not oxidized and polluted in manufacturing and storage, ensuring that a reliable junction can be obtained.

According to a manufacturing method of a surface mounting semiconductor device or a semiconductor mounting component of the present invention, a mounting surface for mounting by solder is provided with a solder-plated layer, and, thereafter, immersed within a solution containing a composition including carbon to form an oxide coating containing at least 10% lead oxide on the surface of the solder-plated layer, so that the surface of the solder-plated layer is not oxidized and polluted in the manufacturing and storage, ensuring that a reliable junction during the mounting can be obtained.

What is claimed is:

1. A surface mounting semiconductor device including a mounting surface for mounting of an external lead by soldering, the mounting surface including a metal coated with a metal carbonate.

2. The surface mounting semiconductor device as claimed in claim 1, wherein said mounting surface includes a plated metal layer on which said metal carbonate coating is disposed.

3. A semiconductor device mounting component, selected from the group consisting of a lead frame, a TAB tape, and a circuit board, and including a mounting surface for mounting by soldering or thermal bonding of an electrode or an external lead of a semiconductor chip, the mounting surface including a metal coated with a metal carbonate.

4. The semiconductor device mounting component as claimed in claim 3, wherein said mounting surface includes a plated metal layer on which said metal carbonate coating is disposed.

* * * * *